July 22, 1969 S. E. TOWNSEND 3,457,520

FIELD EFFECT TRANSISTOR BUFFER AMPLIFIER

Filed Aug. 1, 1966

INVENTOR.
STEPHEN E. TOWNSEND

BY

ATTORNEY

United States Patent Office 3,457,520

Patented July 22, 1969

3,457,520

FIELD EFFECT TRANSISTOR BUFFER AMPLIFIER

Stephen E. Townsend, Rochester, N.Y., assignor to Xerox Corporation, Rochester, N.Y., a corporation of New York Filed Aug. 1, 1966, Ser. No. 569,315
Int. Cl. H03f *3/04, 3/14*
U.S. Cl. 330—40 5 Claims

ABSTRACT OF THE DISCLOSURE

A buffer amplifier circuit arrangement in which a bias signal is applied across a coupling device in series with the gate electrode of a field effect transistor. The bias level source, the output of which is to be applied to the gate of the field effect transistor, is isolated from the external power supply to eliminate the load of the power supply. The output of the bias level source is the proper D.C. level potential for application to the base or gate of the field effect transistor to overcome the signal shift caused by internal characteristics therein.

Figure 2:
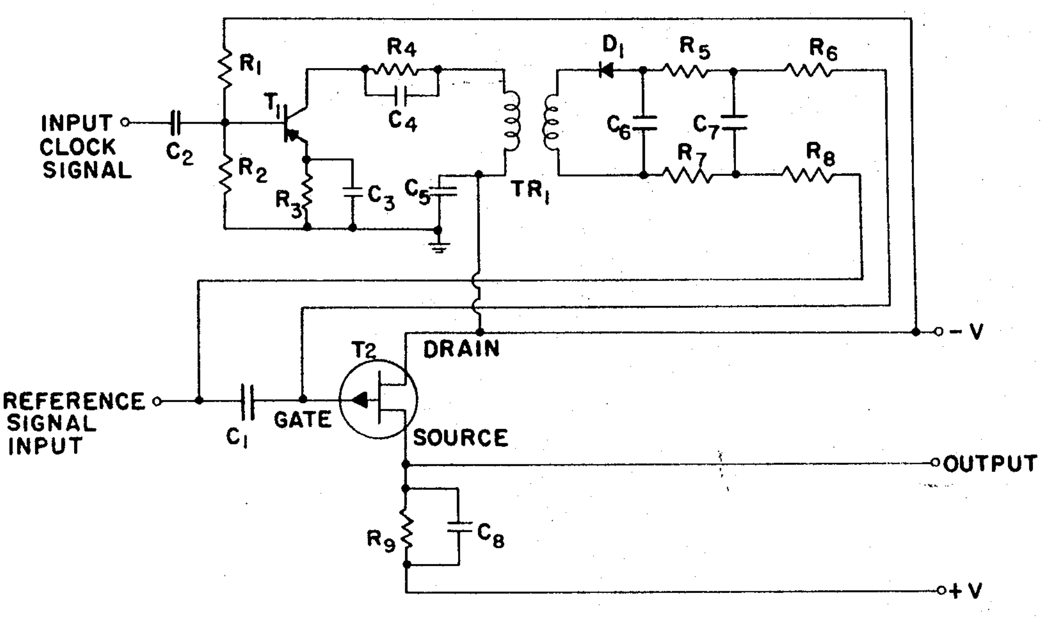

This invention relates to buffer amplifiers and, more particularly, to apparatus for effectively shifting the bias level on the gate of a field-effect transistor without applying an undue load to the input of the transistor.

In the well known conventional transistors, which are commonly termed "bi-polar" transistors, the internal operation takes place by the movement of electrons and holes. Only recently, however, the field-effect transistor has been more prevalently used by design engineers because of certain inherent desirable factors. In a field-effect transistor, only one type of carrier moves, for example, electrons. Such operation closely resembles that of the common electron tube. The field-effect transistor's terminals, which are labeled "gate," "drain," and "source," are analogous to the electron tube's grid, plate and cathode, respectively. A field-effect transistor may be described as a semiconductor device whose channel conductance is controlled by one or more applied voltages. Inasmuch as electron tubes operate with the plate current changing with the applied grid voltage, field-effect transistors offer analogous performance to that of an electron tube.

Field-effect transistors are highly attractive to the design engineer because of the high input impedance resembling that of an electron tube, wherein cascading stages present no measurable loading on previous stages. No power, however, is wasted on heaters, as in an electron tube, with the attendant decrease in power consumption. While the advantage of the high input impedance of the field-effect transistor is desirable in certain applications, there is, in addition, a signal level shift inherent in field-effect transistors due to the forward transfer admittance. In a circuit wherein a field-effect transistor is utilized as an insulation device, as, for example, from low to high impedance, i.e., a cathode or emitter follower, such voltage or signal level shift is undesirable. While an external power supply may be utilized with a resistive network, such a connection would unnecessarily apply a shunt load to the gate of the field-effect transistor. This effect would deleteriously affect the high input impedance of the field-effect transistor for which it is being used.

It is, accordingly, an object of the present invention to provide methods and apparatus for effectively overcoming the signal level shift inherent in a field-effect transistor while utilizing its high input impedance.

It is another object of the present invention to shift the bias level on the gate of a field-effect transistor without applying an unnecessary load to the input of the transistor.

It is another object of the present invention to provide an electrically isolated bias potential source for shifting the bias level on the gate of a field-effect transistor, thereby unaffecting the high input impedance inherent in the field-effect transistor.

In accomplishing the above and other desired aspects, applicant has invented novel apparatus for reducing the shunt loading effect and overcoming the signal shift level in a field-effect transistor. There is disclosed a novel circuit arrangement which applies a bias signal across a coupling device in series with the gate of the field-effect transistor. A bias level source the output of which is to be applied to the gate of the field-effect transistor, is electrically isolated from the external power supply to eliminate the load of the power supply. The output of the bias level source is the proper D.C. level potential for application to the gate of the field-effect transistor by means of the coupling device.

Figure 1:
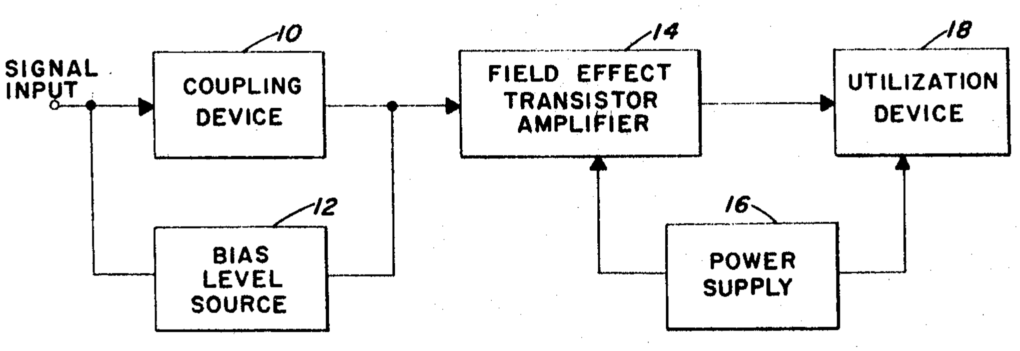

For a more complete understanding of the invention, as well as other objects and further features thereof, reference may be had to the following detailed description in conjunction with the drawings wherein:

FIGURE 1 is a block diagram of the buffer amplifier utilizing the principles of the present invention; and FIGURE 2 is a schematic diagram of the buffer amplifier in accordance with the preferred embodiment of the present invention.

Referring now to FIGURE 1, there is seen a block diagram of the circuit utilizing the principles of the present invention. The field-effect transistor amplifier 14 could comprise a circuit of any design wherein the input stage is, in fact, a field-effect transistor. The signal input, therefore, would be amplified and applied to an output utilization device 18 of any known design and function. Coupled to the field-effect transistor amplifier 14 and utilization device 18 would be a power supply 16, of any known design, to provide the circuits with the necessary voltage potentials.

The field-effect transistor amplifier 14 may comprise in the alternative, for example, a single stage utilizing the field-effect transistor. The utilization device 18 would be any device of design and function to receive the signals from the field-effect transistor 14. In this instance, the field-effect transistor would be operating in a manner similar to that of a conventional electron tube cathode follower amplifier. In this instance, the field-effect transistor would be operating essentially as an impedance matching device for matching a high impedance input circuit to a low impedance circuit, such as utilization device 18, without discriminating against any A.C. frequency. The voltage output of the field-effect transistor 14 may be less than the input voltage, but still be capable of power amplification.

If the input signal source to FIGURE 1 is an A.C. signal of varying amplitude or fluctuating D.C. signal between a first voltage and a second voltage, from a high impedance output circuit, while the utilization device 18 is a circuit of low input impedance, such an impedance matching device as a field-effect transistor must be utilized to prevent signal distortion due to impedance mismatch. The field-effect transistor is particularly adaptable in a high impedance to low impedance circuit matching arrangement, as the inherent factors of the field-effect transistor allow for high impedance input to a low impedance output while still retaining the characteristics of a semi-conductor device. As opposed to a conventional electronic tube, the field-effect transistor does not need a heater supply with its attendant high power drain.

The drawback to the use of a field-effect transistor as an impedance matching device is the signal level shift inherent therein. Thus, even with the desirable aspect of the field-effect transistor with its associated high input impedance, the signal level shift may override the economic value in the use of the field-effect transistor as an impedance matching device. One solution to the signal loss in a field-effect transistor would be to shift the bias potential at the input of the transistor. In effect, therefore, the signal loss in the field-effect transistor would be overcome by the use of the shifted bias potential, so that the output from the field-effect transistor would effectively be the same signal as appeared at the input thereto, with the impedance mismatch compensated for.

The above technique is not altogether satisfactory in that the power supply is not normally as high an impedance as that of the field-effect transistor. That is, utilizing a separate lead from the power supply at the input or gate of the field-effect transistor even with a series resistance network would still apply an impedance which is low relative to the input impedance of the field-effect transistor. Such use of the internal power supply of the circuit, therefore, would be defeating the use of the field-effect transistor and its inherent high impedance characteristic. Signal distortion could develop, therefore, because the signal output from the high impedance source would not see the high input impedance of the field-effect transistor, but the parallel combination of the high input impedance to the transistor and the relatively low impedance of the power supply and resistance bias level. The bias level source, therefore, must be isolated from the power supply in order not to defeat the impedance effect of the transistor. Bias level source 12 is therefore provided across a coupling device 10, in FIGURE 1, in order to shift the bias level across the input to the field-effect transistor without defeating the high input impedance aspect of the field-effect transistor. The coupling device 10 may comprise, for example, any circuit arrangement capable of transferring A.C. or fluctuating D.C. signals without signal loss or distortion. The bias level source 12 may be a simple D.C. battery of the particular potential necessary to overcome the signal level shift in the field-effect transistor 14.

In FIGURE 2 is shown a preferred embodiment of the circuit as shown in FIGURE 1, in accordance with the principles of the present invention. The use of a battery, as described in conjunction with FIGURE 1, is a perfectly acceptable bias level source; however, batteries do not maintain their voltage potential for long periods of time and thus a circuit arrangement which performs the bias level shift without introducing an unnecessary shunt load across the input to the field-effect transistor is desirable. In FIGURE 2, therefore, is shown the field-effect transistor T2 as set apart from the rest of its circuit arrangement. At the input of the field-effect transistor, in series with the input signal source, is a capacitor C1. Across the capacitor C1 is a D.C. power supply which by means of the transformer TR1 is isolated, "floating," from the power supply of the circuit. In the embodiment shown, therefore, an input clock signal, as derived from any known source, is applied to the input of a conventional transistor T1. The transistor receives its bias potential from the circuit power supply source of —V volts through resistor R1 and the primary winding of transformer TR1 through resistor R4 in parallel with capacitor C4 to the collector of the transistor T1. Resistor R3 and, in parallel therewith, capacitor C3 is connected from the transistor T1 emitter to ground. Resistor R2 is connected from the base of transistor T1 also to ground. A capacitor C2 is provided at the input to couple the input clock signal to the base of the transistor T1.

After the input clock signal at a predetermined frequency is amplified by the transistor T1, the transformer TR1 transfers the amplified A.C. signal to the secondary of the transformer and then to the half-wave rectifier circuit as provided by diode D1 and resistors R5, R6, R7 and R8 with capacitors C6 and C7 acting as a filter circuit. The D.C. level, therefrom is applied across the capacitor C1, which effectively shifts the bias level a predetermined amount as is designed by the amplifier circuit.

In effect, therefore, the bias level across the gate of the field-effect transistor is shifted to a point where the swings of the applied input signal are maintained at the output of the field-effect transistor at the desired potentials. By means of the circuit, as shown in FIGURE 2, such bias shift is accomplished without applying a low impedance shunt across the input to the transistor because of the transformer coupling the amplifying and rectifying portions of the bias level source. Thus, the high input impedance characteristic of the field-effect transistor is maintained, while the signal level shift is overcome by the provided bias level source across the input coupling capacitor.

In the foregoing, there has thus been disclosed methods and apparatus for overcoming the signal loss due to the high impedance in a field-effect transistor. While the preferred embodiment has been described for a field-effect transistor circuit in an impedance matching arrangement, it is apparent that other circuit arrangements utilizing a field-effect transistor may be utilized in overcoming the inherent signal level shift therein without violating the principles of the present invention. Other circuit arrangements with different component values may be utilized therefor in accordance with the disclosed invention. Thus, while the present invention, as to its objects and advantages, as described herein, has been set forth in specific embodiments thereof, they are to be understood as illustrative only and not limiting.

What is claimed is:

1. A buffer amplifier comprising
a signal input terminal,
a field-effect transistor of one impurity type with gate, drain and source electrodes, said transistor having an inherent gate to source electrode admittance causing a signal level shift,
an amplified signal output terminal, said source electrode being connected to said output terminal,
coupling means for connecting said transistor gate electrode to said input terminal,
a first bias level source coupled to said transistor drain and source electrodes for providing operating voltage potentials,
a second bias level source connected to said input terminal and said transistor gate electrode for providing a bias level potential sufficient to overcome said signal level shift in the field-effect transistor, and
means for electrically isolating said second bias level source from said first bias level source.

2. The buffer amplifier as defined in claim 1 wherein said second bias level source is a D.C. storage battery.

3. In an electrical circuit wherein a signal source of high output impedance is coupled to a field-effect transistor of high input impedence and inherent inter-electrode admittance causing a signal level shift, an improved buffer amplifier comprising,
coupling means for connecting said transistor to said signal source,
a bias level source applied to said coupling means for providing a bias level sufficient to overcome said signal level shift in said field-effect transistor, and
means for electrically isolating said bias level source so as to retain the high impedence relationship of said signal source with said field effect transistor.

4. The buffer amplifier as defined in claim 3 wherein said bias level source is a D.C. storage battery.

5. A buffer amplifier comprising
a signal input terminal,
a field-effect transistor of one impurity type with gate, drain and source electrodes, said transistor having an inherent gate to source electrode admittance causing a signal level shift,
an amplified signal output terminal, said source electrode being coupled to said output terminal, coupling means for connecting said transistor gate electrode to said input terminal, a first bias level source coupled to said transistor drain and source electrodes for providing operating voltage potentials, a second bias level source connected to said input terminal and said transistor gate electrode for providing a bias level potential sufficient to overcome said signal level shift in the field-effect transistor, means for electrically isolating said second bias level source from said first bias level source, an input alternating current signal applied to said input terminal, and wherein said coupling means to said input terminal includes a capacitor, said second bias level source further including means for amplifying said input signal, rectifying and filter means for converting said amplified signal from an alternating current signal to a direct current signal, means for applying said direct current signal to said capacitor, whereby the input bias level to the gate of said field-effect transistor is shifted, and wherein said electrically isolating means includes a transformer for transferring said amplified signal to said rectifying and filter means.

References Cited

UNITED STATES PATENTS 3,305,638 2/1967 Teachout ____________ 330—38

OTHER REFERENCES

Lott: "FET Increases Schmitt Trigger Input Impedance," Electronics, p. 65, July 26, 1965.

ROY LAKE, Primary Examiner

L. J. DAHL, Assistant Examiner

U.S. Cl. X.R.

330—38